(12) United States Patent
Hu et al.

(10) Patent No.: US 7,805,687 B2
(45) Date of Patent: Sep. 28, 2010

(54) ONE-TIME PROGRAMMABLE (OTP) MEMORY CELL

(75) Inventors: YongZhong Hu, Cupertino, CA (US); Yu Cheng Chang, Cupertino, CA (US); Sung-Shan Tai, San Jose, CA (US)

(73) Assignee: Alpha & Omega Semiconductor, Ltd. (BM)

( * ) Notice: Subject to any disclaimer, the term of this patent is extended or adjusted under 35 U.S.C. 154(b) by 1004 days.

(21) Appl. No.: 11/541,369

(22) Filed: Sep. 30, 2006

(65) Prior Publication Data

US 2007/0069297 A1    Mar. 29, 2007

Related U.S. Application Data

(63) Continuation-in-part of application No. 11/122,848, filed on May 5, 2005, now Pat. No. 7,256,446.

(51) Int. Cl.
*G06F 17/50* (2006.01)
(52) U.S. Cl. .................................... 716/1; 716/4; 716/5
(58) Field of Classification Search .................... 716/1, 716/4, 5; 257/316, 321, 355
See application file for complete search history.

(56) References Cited

U.S. PATENT DOCUMENTS

| | | | | |
|---|---|---|---|---|
| 5,331,196 | A * | 7/1994 | Lowrey et al. | 257/529 |
| 7,256,446 | B2 * | 8/2007 | Hu et al. | 257/316 |
| 7,492,005 | B2 * | 2/2009 | Chang et al. | 257/330 |

\* cited by examiner

*Primary Examiner*—Sun J Lin
(74) *Attorney, Agent, or Firm*—Bo-In Lin

(57) ABSTRACT

A method of performing a programming, testing and trimming operation is disclosed in this invention. The method includes a step of applying a programming circuit for programming an OTP memory for probing and sensing one of three different states of the OTP memory for carrying out a trimming operation using one of the three states of the OTP memory whereby a higher utilization of OTP memory cells is achieved. Selecting and programming two conductive circuits of the OTP into two different operational characteristics thus enables the storing and sensing one of the three different states of the OTP memory. These two conductive circuits may include two different transistors for programming into a linear resistor and a nonlinear resistor with different current conducting characteristics. The programming processes include application of a high voltage and different programming currents thus generating different operational characteristics of these two transistors.

22 Claims, 6 Drawing Sheets

ONE-TIME PROGRAMMABLE (OTP) MEMORY CELL

This Patent application is a Continuation in Part (CIP) Application of application Ser. No. 11/122,848 filed by common Inventors of this Application on May 5, 2005 and issued into U.S. Pat. No. 7,256,446 on Aug. 14, 2007. The Disclosures made in that Application is hereby incorporated by reference.

BACKGROUND OF THE INVENTION

1. Field of the Invention

The invention relates generally to the structure and manufacturing process of the programmable memory devices and the circuit configuration and method of operations of the programmable memory devices. More particularly, this invention relates to an improved device configuration and a new circuit configuration and method operations for implementing a one-time programmable memory cell with three states.

2. Description of the Relevant Art

In order to reduce the production cost and to shorten the time-to-market of the integrated circuit (IC) products, the design houses are increasingly relying on the readily available foundry processes to carry out the prototyping and manufacturing. However, the device features that are tailored for post-package trimming require additional intellectual property (IP) modules or fuse. These IP modules may include one time programmable (OTP) memory or the electrical erasable programmable read only memory (EEPROM) provided by the foundry with additional costs. Fuse trimming may be carried out on these programmable memory cells to implement these IP modules for providing the products with specified device features. However, the fuse trimming operations require dedicated testing equipment with specific test configuration setup for supplying high current for fuse trimming. These extra processing or testing requirements cause delays for shipping the products to the market and also increase the production costs. Therefore, it is highly desirable to reduce as much as possible the post-packaging trimming and testing requirements while still achieve the required device features.

However, the goal of reducing post-packaging trimming and testing requirements cannot be easily achieved due to the fact that the conventional techniques of configuring and designing the OTP memory or EEPROM cell for IC devices involve complex device configurations and manufacturing and trimming processes. Many patented inventions have disclosed techniques in attempt to resolve these difficulties. In U.S. Pat. No. 4,698,900 a method for making a non-volatile memory with dielectric filled trenches was disclosed. The invention provides a cross point EPROM array that has trenches to provide improved isolation between adjacent buried N+ bit-lines at locations where the adjacent buried N+ bit-lines are not separated by a FAMOS transistor. This results in improved leakage current, improved punch-through voltage characteristics, and in improved programmability for the cell. In another U.S. Pat. No. 6,215,140, Reisinger, et al. disclosed an electrically programmable non-volatile memory cell configuration. The semiconductor substrate is of the first conductivity type. Trenches are aligned to be parallel to one another and are incorporated in the semiconductor substrate, and first address lines run along the sidewalls of the trenches. Second address lines are formed on the semiconductor substrate, transversely with respect to the trenches. Semiconductor substrate regions, in which a diode and a dielectric whose conductivity can be changed are arranged, are located between the first address lines and the second address lines. A suitable current pulse can be used to produce a breakdown in the dielectric, with information thus being stored in the dielectric. U.S. Pat. No. 6,584,029 disclosed a one-time programmable memory using fuse/anti-fuse and a vertically oriented fuse unit memory cell. The one-time programmable ("OTP") memory includes one or more memory arrays stacked on top of each other. The OTP memory array is a cross-point array where unit memory cells are formed at the cross-points. The unit memory cell may include a fuse and an anti-fuse in series with each other or may include a vertically oriented fuse. Programming the memory may include the steps of selecting unit memory cells, applying a writing voltage such that critical voltage drop across the selected cells occur. This causes the anti-fuse of the cell to break down to a low resistance. The low resistance of the anti-fuse causes a high current pulse to be delivered to the fuse, which in turn melts the fuse to an open state. Reading the memory may include the steps of selecting unit memory cells for reading, applying a reading voltage to the selected memory cells and measuring whether current is present or not.

The above patented memory cell configurations however does not provide a solution to allow for application of standard foundry processes to enable low-cost post-packaging trimming requirements. Furthermore, current state of art produces only two-states OTP for memory applications. Increasing the states of each OTP cell will increase the memory density in the same semiconductor area as the number of states directly related to the density of information stored. Therefore, a need still exists in the art to provide an improved memory configuration and manufacturing methods to provide the one-time programmable (OTP) memory cells using standard foundry process and also allowing for storing and sensing three states of data-bit storage in the OTP memory such that the above discussed difficulties as now encountered in the prior art can be resolved

SUMMARY OF THE PRESENT INVENTION

It is therefore an aspect of the present invention to provide a new and improved one-time programmable (OTP) memory cell by using standard IC manufacturing processes commonly implemented in the foundries to achieve low production cost such that the above discussed difficulties and limitations may be resolved.

It is another aspect of this invention to provide new and improved integrated circuit testing and trimming system by implementing a tester for providing alternate signals to an one-time programmable (OTP) memory for detecting three different states of the OTP for carrying out a trimming operation depending on one of the three states of the OTP whereby a higher utilization of OTP memory cells is achieved.

It is another aspect of the present invention to provide a one-time programmable (OTP) memory cell by taking advantage of the sidewall and corner breakdown features of a thin oxide layer overlying a polysilicon segment. The phenomena of etch undercut that occurs prior to a processing step of gate oxidation further degrades the breakdown property of the thin oxide. It is a common practice in the processes of manufacturing a integrate circuit (IC) device to take special care for preventing the development of the vulnerable points caused by the inter-poly breakdown due to the etch undercut phenomenon. Specifically, special attention is required in fabricating the conventional IC poly-poly capacitors or flash/EEPROM memory to prevent the breakdown vulnerability in these inter-poly coupling layers. Such special requirements may include an implementation of the high quality oxidenitride-oxide composite layers as that commonly practiced in the electronic device manufacturing processes. Conversely, as disclosed in this invention, the weakness of the inter-poly sidewall oxide breakdown that commonly considered as an undesirable feature is utilized to realize an advantageous structural feature to more conveniently carry out an enhanced programming mechanism for the OTP cell. With a thin oxide layer covering an undercut corner to conveniently induce a breakdown, the conductivity between two polysilicon layers can be more conveniently generated. The poly segment sidewall configuration that commonly considered as undesirable structural feature is implemented for inducing a breakdown and for changing the conductivity state to perform the one-time program function.

Briefly in a preferred embodiment this invention discloses a method of performing an integrated testing and trimming operation. The method includes a step of implementing a tester for providing alternate signals to an one-time programmable (OTP) memory for detecting three different states of the OTP memory for carrying out a trimming operation using one of the three states of the OTP memory whereby a higher utilization of OTP memory cells is achieved. The method further includes a step of operating the OTP memory by selecting two conductive circuits with two alternating operational characteristics for storing and sensing the three different states of the OTP memory. The method includes selecting a first conductive circuit operated as a linear resistor and alternately a second conductive circuit as a non-linear resistor for storing and sensing the three states of the OTP memory.

This invention further discloses an one-time programmable (OTP) memory cell. The OTP memory cell includes a dielectric layer disposed between two conductive polysilicon segments wherein the dielectric layer is ready to change from a non-conductive state to a conductive state through an induced voltage breakdown. In a preferred embodiment, one of the conductive polysilicon segments further includes an etch undercut configuration for conveniently inducing the voltage breakdown in the dielectric layer. In another preferred embodiment, one of the conductive polysilicon segments further includes an etch undercut configuration for conveniently inducing the voltage breakdown in the dielectric layer via a corner electrical field effect. In another preferred embodiment, the dielectric layer constituting a sidewall covering one of the conductive polysilicon segments with an etch undercut configuration for inducing the voltage breakdown in the dielectric layer via an edge electrical field effect. In another preferred embodiment, one of the conductive polysilicon segments further includes a corner for conveniently inducing the voltage breakdown in the dielectric layer via a corner electrical field effect. In another preferred embodiment, the OTP memory cell further includes a semiconductor substrate having an insulating layer disposed on a top surface of the substrate for supporting the OTP memory cell thereon. In another preferred embodiment, the OTP memory cell further includes an insulating passivation layer covering the OTP memory cell and the insulating passivation layer further includes contact opening for depositing electrode metal therein to for electrically contacting the conductive polysilicon segments to function as electrodes. In another preferred embodiment, the conductive polysilicon segments are conductive impurity doped polysilicon segments. The conductive polysilicon segments can be a P-type impurity doped or N-type impurity doped polysilicon segment.

This invention further discloses a method for manufacturing a one-time programmable (OTP) memory cell. The method includes a step of disposing a dielectric layer between two conductive polysilicon segments for readily inducing a voltage breakdown in the dielectric to change from a non-conductive state to a conductive state for carrying out a one-time program operation. In another preferred embodiment, the method further includes a step of forming one of the conductive polysilicon segments with an etch undercut configuration for conveniently inducing the voltage breakdown in the dielectric layer. In another preferred embodiment, the method further includes a step of forming one of the conductive polysilicon segments with an etch undercut configuration with a corner for conveniently inducing the voltage breakdown in the dielectric layer via a corner electrical field effect. In another preferred embodiment, the method further includes a step of forming one of the dielectric layer as a sidewall covering one of the conductive polysilicon segments with an etch undercut configuration for inducing the voltage breakdown in the dielectric layer via an edge electrical field effect. In another preferred embodiment, the method further includes a step of forming one of the conductive polysilicon segments with a corner for conveniently inducing the voltage breakdown in the dielectric layer via a corner electrical field effect.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
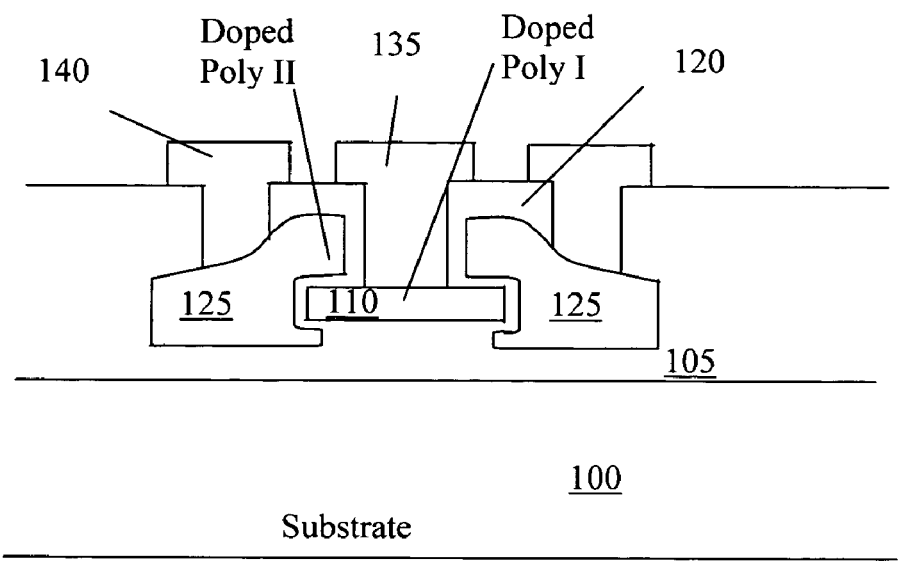
FIG. 1 is a side cross sectional view of a one-time programmable memory cell of this invention.

Referring to FIG. 1 for a one-time programmable memory cell of this invention supported on a thick field oxide layer 100 formed on a top surface of a semiconductor substrate 100. The thick field oxide layer 105 insulates the cell from the substrate 105. A first doped poly region 110 insulted with a thin layer low voltage gate oxide 120 from a second doped polysilicon region 125. Each poly region has an electrode, e.g., electrodes 135 and 140 respectively, connected for data recording and reading. The thin gate oxide layer 120 between the two doped poly regions blocks the conductivity between the two doped poly regions 110 and 125. However, the conducting status between the two doped poly regions 110 and 125 may be changed for the purpose of programming the memory. In the process of programming the memory cell as shown in FIG. 1, a high voltage may be applied to the electrodes between doped poly regions 110 and 125. When the voltage is high enough, a breakdown is induced in the single crystal thin gate oxide layer 120 and becomes conductive. The high voltage therefore changes the conductance between the two doped poly regions 110 and 125 and is employed to store a binary bit in the cell. The threshold voltage is related to the thickness as well as the micro microstructure of the oxide layer 120.

Referring to FIG. 1 again for the key features as that shown in the OTP structure, particularly the relative positions of the second polysilicon poly-2 segment 125 over the first polysilicon poly-segment 110. The sidewall 120 overlaying the poly-1 segment 110 includes a bottom corner undercut 120-UC segment extending below the poly-1 segment 110. With the undercut 120-UC and edge effects of the thin oxide layer 120 as sidewall covering the poly-1 segment 110, a breakdown can be conveniently induced and the state of conductivity can be more easily changed for writing a binary bit into the memory cell by applying a high voltage over the electrodes 135 and 140.

Figure 2A:
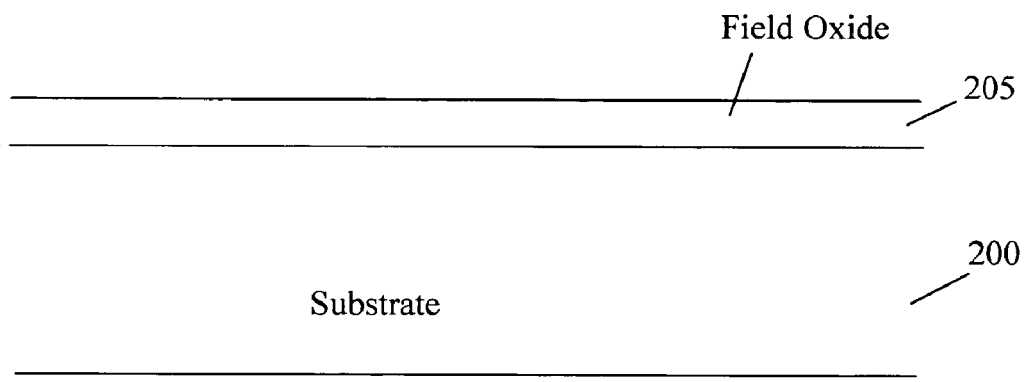
FIGS. 2A to 2G are a serial of side cross sectional views for illustrating the processing steps for manufacturing the OTP memory cell of FIG. 1.
Figure 2B:
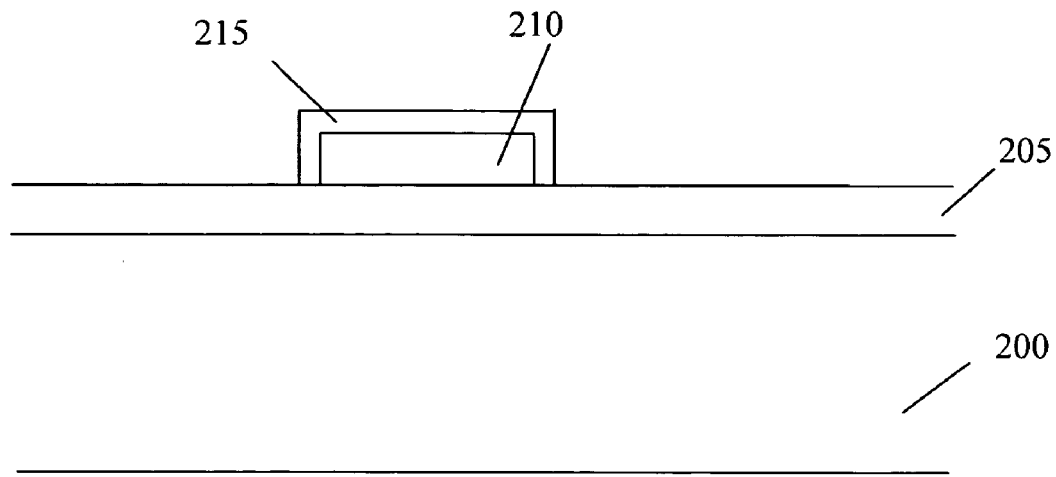

Referring to FIGS. 2A to 2F for a serial of side cross sectional views for the illustration of the processing steps to fabricate the one-time programmable memory cell of FIG. 1. In FIG. 2A, a field oxide layer 205 of approximately three to eight Angstrom thickness is formed on top of a semiconductor substrate 200 by using a thermal oxidation process. In FIG. 2B, a polysilicon layer 210 of approximately 500 to 2000 Angstroms in layer thickness is deposited on top of the field oxide layer 205. A N-type or P-type ion implant with an ion flux intensity of approximately $1\times10^{14}$ to $1\times10^{15}/cm^2$ is then carried out over the polysilicon layer 210 to make the poly-1 more conductive. A mask is then applied to etch and pattern the polysilicon layer 210 to form a poly-1 segment 210 as shown. A high voltage oxide layer 215 is grown over the poly-1 segment.

Figure 2C:
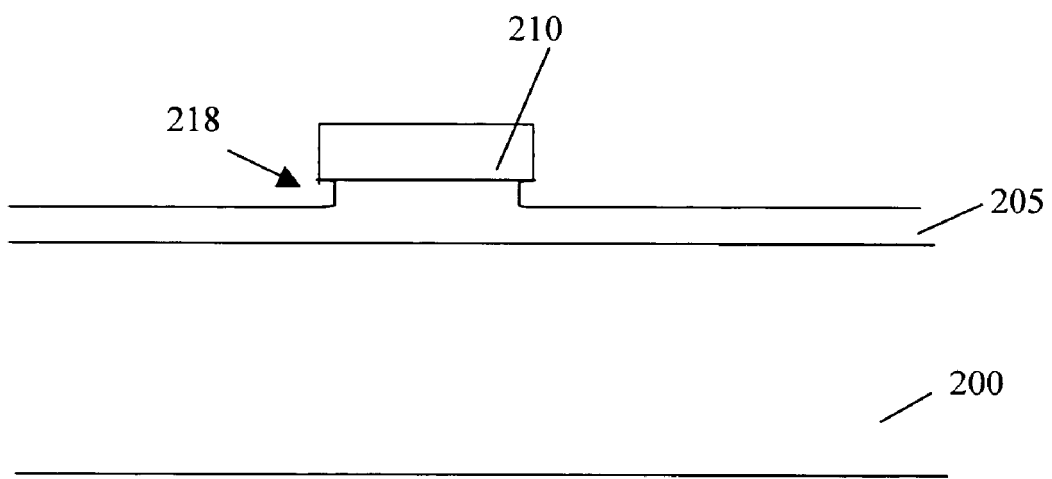
Figure 2D:
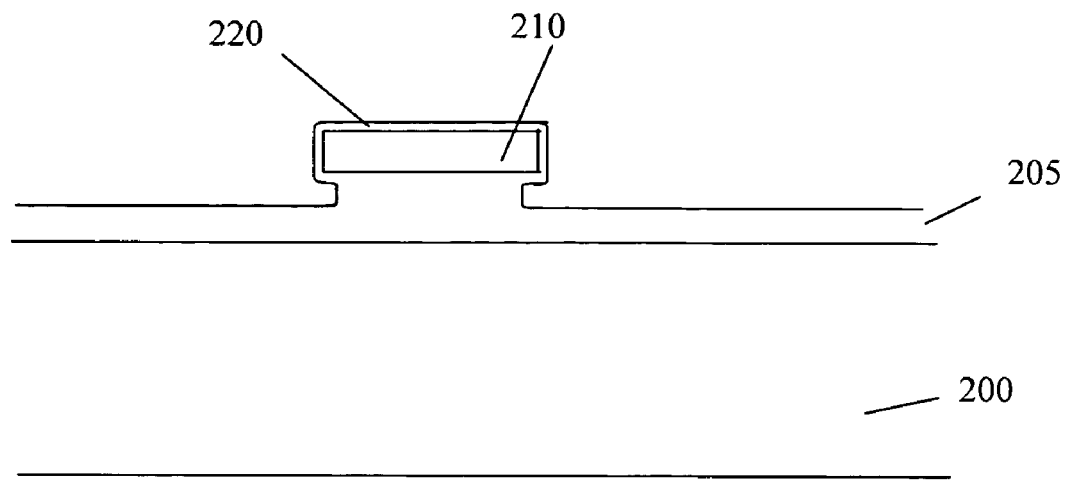
Figure 2E:
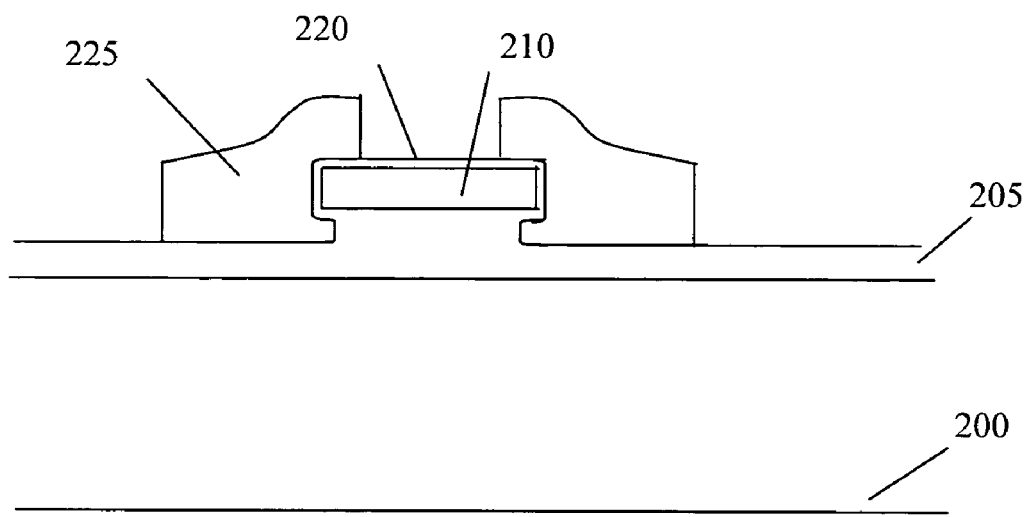
Figure 2F:
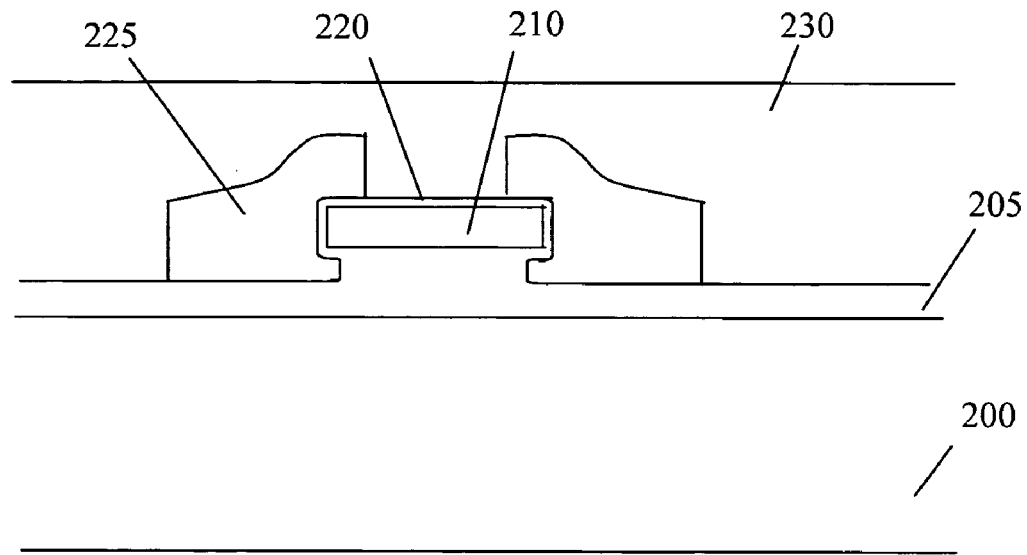
Figure 2G:
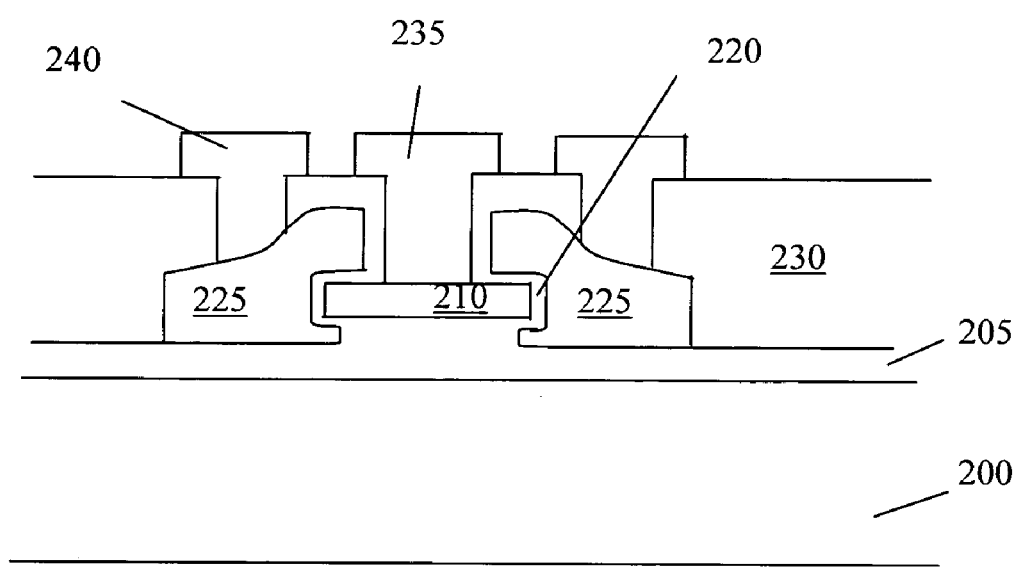

In FIG. 2C, the high voltage oxide layer 215 is etched off in the active cell area and maintaining the high voltage oxide layer in the peripheral region to support the high voltage recording operation. The etch process produces an undercut 218 below the edge of the poly-1 segment 210. In FIG. 2D, a thin layer of low voltage oxide 220 of approximately 120 Angstroms in thickness is grown over the poly-1 segment 210. In FIG. 2E, a second polysilicon layer 225 is deposited. An ion implant is carried out on the second polysilicon layer 225 with a similar dopant concentration with either a N-type or P-type ions. Then a mask is applied to etch and pattern the second polysilicon layer 225 as that shown in FIG. 2E. In FIG. 2F, an oxide or BPSG layer 230 is deposited over the top to cover the entire top surface. Then in FIG. 2G, a contact mask is applied to open contact holes in the BPSG layer 230 and the metal contact is then deposited into the contact openings to form the electrodes 235 and 240 for establishing electric contacts to the doped poly-1 and poly 2 layers 210 and 225 respectively.

Figure 3:
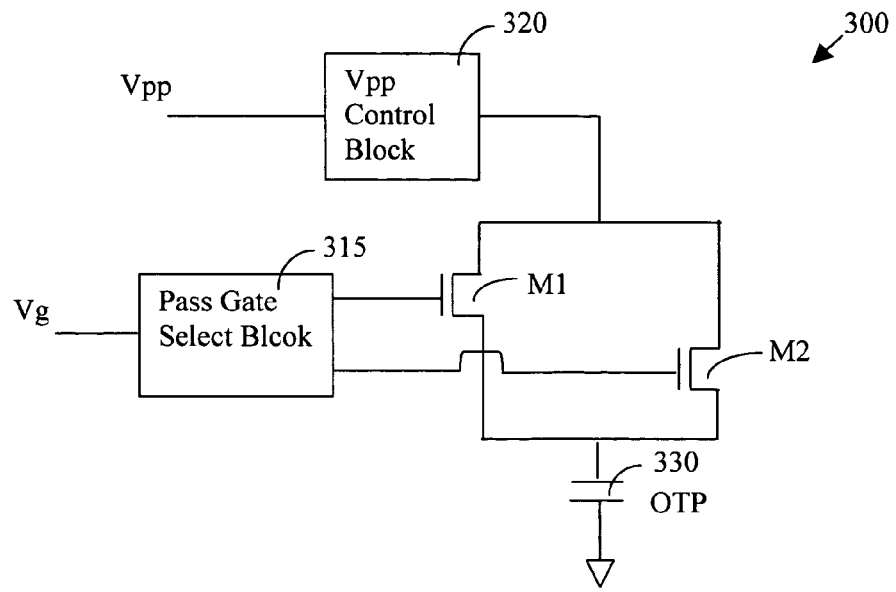
FIG. 3 is a circuit diagram for showing an one-time programmable (OTP) memory device included in a trimming circuit to carry out a circuit trimming operation.

Referring to FIG. 3 for illustrating the OTP trimming cell 300 wherein a pass gate select block 315 is connected to a first transistor M1 and a second transistor M2. The first transistor M1 and the second transistor M2 are connected with a source terminal to a control block 320 for receiving and applying a programming voltage Vpp where the Vpp may be between 15 to 18 volts. A polysilicon-insulator-polysilicon (PIP) OTP cell 330 is connected to the drain terminal of the M1 and M2 with another electrode of the OTP cell 330 connected to a ground or low voltage. The transistor M1 functions as a pass gate to deliver more than 2 mA current with Vds=12-18V. The second transistor M2 functions as another pass gate to conduct a limited current less than 500 uA while the programming voltage is applied between the drain and source to provide a drain to source voltage Vds=12-18V. Both gates of the pass transistors are controlled by a trimming circuitry controlled by a tester (not shown). Table 1 below summarizes the operations of the trimming operations:

TABLE 1

| Pass Gate Selected | Programming Current | OTP State |
|---|---|---|
| M1 | ≧2 mA | Linear Resistor |
| M2 | ≦500 µA | Non-linear Resistor |
| None | 0 | Untrimmed (High Impedance-HZ) |

Figure 4:
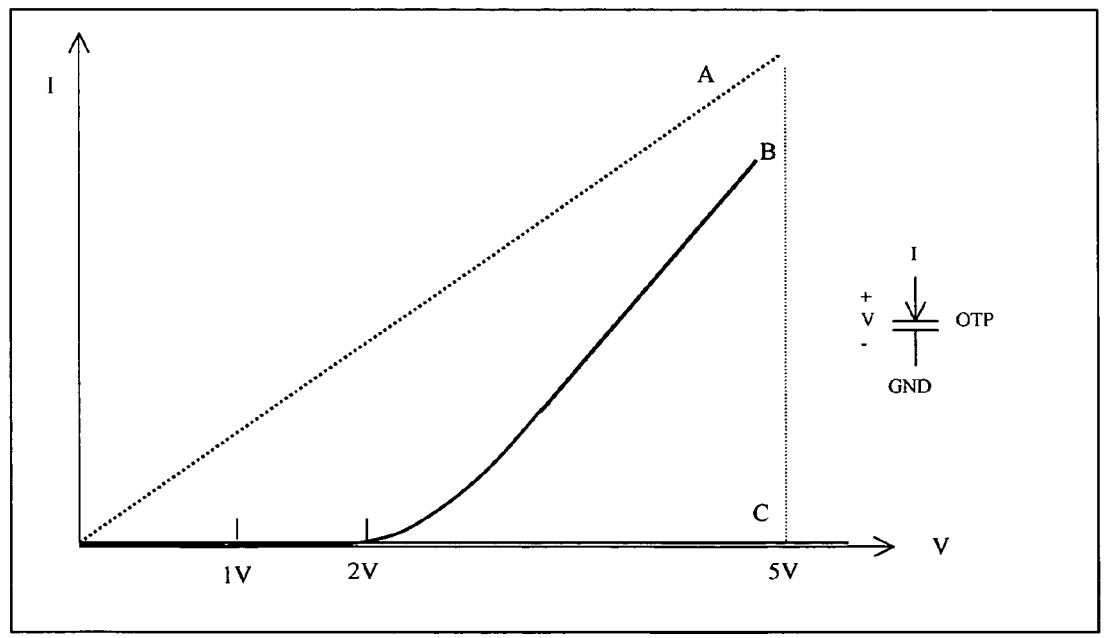
FIG. 4 is a current-voltage diagram for showing the OTP states for operating the circuit of FIG. 1 during different trimming operations.

Referring to FIG. 4 for a diagram of the operational states of the OTP memory. Referring to FIG. 3, both M1 and M2 are connected in series with the OTP cell 330. When M1 is selected at trimming, the OTP cell is programmed into a linear resistor as shown in the dotted line A. When M2 is selected at trimming, the OTP cell is programmed into a non-linear resistor as shown in curve B that is non-conducting below 2V and conducting above 3.5V. By applying a two-level sensing scheme at 1V and 5V, the OTP cell can be read as three states total. The Table 2 blow summaries the two level sensing at one volt and five volt:

TABLE 2

| Sensing States | Sensing at One volt | Sensing at five volts |
|---|---|---|
| A: linear Resistor | Conducting | Conducting |
| B: nonlinear Resistor | High Impedance | Conducting |
| C | High Impedance | High Impedance |

Referring again to FIGS. 1 and 4 for a diagram of the operational states of the OTP memory after a programming operation is performed on the OTP. When no voltage is applied during programming, the conducting status between the two doped poly regions 110 and 125 is characterized as status C wherein thin gate oxide layer 120 is intact and acting as an insulator therefore no current flows between the two doped poly regions 110 and 125 when a lower than breakdown probing voltage is applied. During programming when a high voltage is applied to the memory cell without limiting the trimming current, thin gate oxide layer 120 will breaks down and become a linear conductor. The conducting status between the two doped poly regions 110 and 125 is then characterized by status A wherein the current linearly increases with probing voltage. The memory cell can therefore be programmed into a two-state memory cell as characterized by state A and C. However during high voltage programming if the trimming current is limited, the thin gate oxide layer 120 breaks down and become a nonlinear resistor, generating an intermediate state. This third state is characterized by curve B wherein the current only flows when the probing voltage is higher than a certain level. Therefore, the memory cell can be further programmed as a tri-state memory cell.

Figure 5:
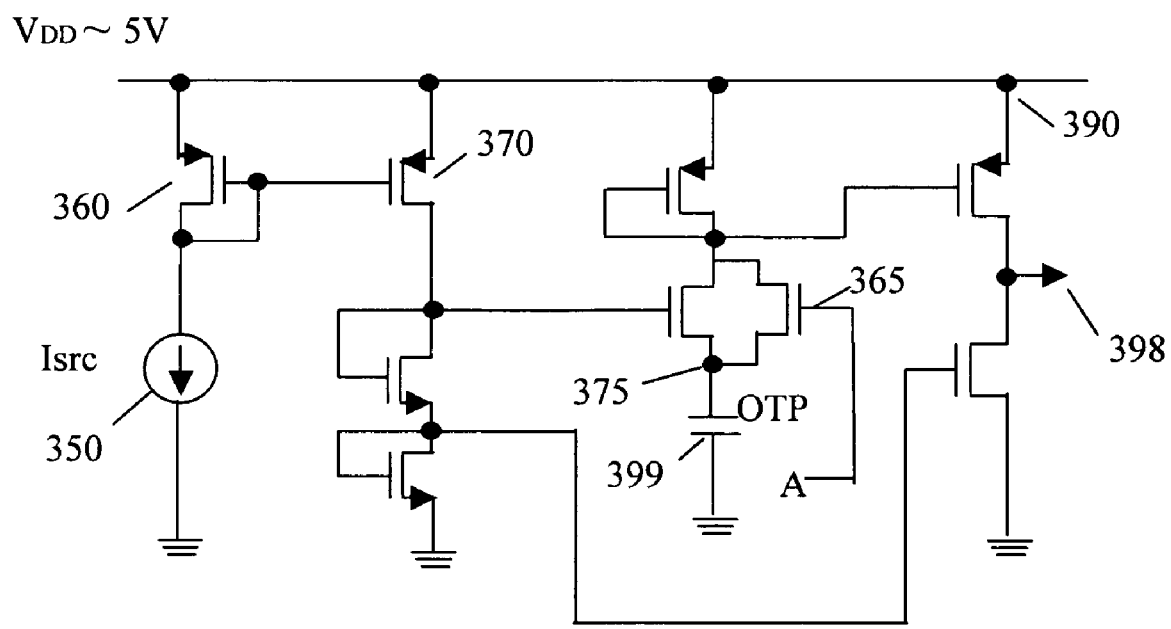
FIG. 5 is a circuit diagram for creating two different voltages crossing an one-time programmable memory with a sensing electrode for reading the state of the OTP memory.

Referring to FIG. 5 for an exemplary circuit diagram for generating two different voltages across the OTP memory 399 and for carrying out a two-level sensing three state operations as that shown in FIG. 2. A current source 350 provides current to devices 360 and 370 forming a current mirror. When the switching transistor 365 is turned ON, the nodes 375, has approximately 4 volts thus the OTP is sensed at 4 volts. When the switching transistor 365 is turned OFF, the node 390 has a voltage drop of approximately a threshold voltage Vth, the nodes 375 has approximately 1 volt thus the OTP is sensed at one volt. The output voltage 398 is sensed at three states as that described below.

When the node 365 is on, the voltage across the OTP memory 399 is about 4 volts and when the node 365 is off, the voltage across the OTP memory 399 is about one volt. The voltage at node 365 is controlled by a clock signal generated from a control signal generator. The process begins with a step of receiving a low voltage control signal at node 365 to turn off the transistor and generate an voltage across OTP 399 around one volt. According to FIG. 3, if the OTP is at a state of operating as a linear resistor trimmed by transistor M1, then the OTP consumes more current than the current source 350 can provide through the current mirror and that pulls up the voltage on the output node 398. The logic output of 398 is 1. On the other hand, when the OTP is at a state of operating as a nonlinear resistor trimmed by transistor M2, then the OTP consumes no current and the current flow through node 390 pulls the voltage at node 398 to a low voltage. The logic output of 398 is 0. Furthermore, if none of the pass gate transistors was selected to trim the OTP, that neither M1 nor M2 were turned on, and a high impedance condition is operated with the OTP, then again, the OTP 399 consumes no current. Then, the current flow through node 390 pulls the output voltage at node 398 to a low voltage. The logic output of 398 is 0.

When a high voltage control signal received by gate 365 turns on the transistor the voltage across the OTP is around 4 volts. According to FIG. 3 when the OTP 399 is functioning as a linear resistor, then the OTP consumes more current than the current source 350 can provide through the current mirror and that pulls up the voltage on the output node 398. When the OTP 399 is functioning as a nonlinear resistor, still the OTP consumes more current than the current source 350 can provide through the current mirror and that also pulls up the voltage on the output node 398. Furthermore, if none of the pass gate transistors was selected, that neither M1 nor M2 were turned on during trimming process, and a high impedance condition is operated with the OTP and the OTP 399 consumes no current. Then, the current flow through node 390 pulls the output voltage at node 398 to a low voltage.

As described above, the circuit shown in FIG. 5 is used to create two different voltages crossing an OTP, e.g., one volt or four volts. When the transistor controlled by the gate 365 is turned on, the voltage across the OTP is around 4 volts, and when it is turned off, the voltage across the OTP 399 is around one volt. According to FIG. 3 and FIG. 4, the OTP 399 has different current characters at corresponding crossing voltages. The output electrode 398 is therefore able to sense the operation states of the OTP. The purpose of FIG. 5 is used to show an exemplary embodiment that the operation states of the OTP that operable with three states, i.e., State A, B, and C, are readable by checking the voltage at nodes 365 and 398 as summarized in Table 3 below. By looking at the table 3 of the output at node 398 for the on and off condition at node 375, the state of OTP can be identified.

TABLE 3

|  | STATE A | STATE B | STATE C |
| --- | --- | --- | --- |
| 1 v source Node 398 | consume current logic 0 | no current flow logic 1 | no current flow logic 1 |
| 5 v(2 v) source Node 398 | consume current logic 0 | consume current logic 0 | no current flow logic 1 |

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method of configuring and applying a one-time programmable (OTP) memory comprising:
    implementing a tester for providing alternate signals to electively connect a one-time programmable (OTP) memory to two different transistors with two different current-voltage (I-V) characteristics to write the OTP memory and selectively connecting the OPT memory to the two different transistors for applying two different voltages thereon through one of said two different transistors for detecting three different states of the OTP memory.

2. The method of claim 1 further comprising:
    connecting a switching circuit between an input voltage source and said two different transistors for selectively applying said two different voltages to switch and applying said two different voltages through one of said two different transistors to said OTP memory for sensing said three different states of the OTP memory.

3. The method of claim 1 wherein:
    said step of connecting the OTP memory to said two different transistors with two different current-voltage characteristics to write the OTP memory further comprising a step of connecting a first transistor having a linear I-V characteristic and a second transistor having a non-linear I-V characteristic to the OTP memory.

4. The method of claim 1 further comprising:
    configuring the OTP memory by forming a first polysilicon segment supported on a semiconductor substrate with an etched undercut space below said first polysilicon segment; and
    forming an inter-polysilicon insulation layer and a second polysilicon layer over said inter-polysilicon insulation layer with said second polysilicon layer extending from sidewalls of said first polysilicon segment into said etch undercut space below said first polysilicon segment wherein said inter-polysilicon insulation layer is disposed near corner edges of said first polysilicon segment and said second polysilicon layer.

5. A one-time programmable (OTP) memory cell comprising:
    an OTP memory comprising an intrinsically non-conductive circuit programmable by selectively applying a trimming voltage to trim the circuit into a conductive state; and
    two different transistors, namely a first transistor and a second transistor, having two different current-voltage (I-V) characteristics connected to said OTP memory for applying two different voltages through one of said two different transistors for sensing three different states of the OTP memory cell.

6. The OTP memory cell of claim 5 further comprising:
    a switching circuit connected between an input voltage source and said two different transistors, wherein said input voltage source applying said two different voltages and said switching circuit selectively switches and applies said two different voltages through one of said two different transistors to said OTP memory.

7. The OTP memory cell of claim 5 wherein:
    said first transistor having a linear I-V characteristic and said second transistor having a nonlinear I-V characteristic.

8. The OTP memory cell of claim 5 wherein:
    said first transistor having a linear I-V characteristic and said second transistor having a nonlinear I-V characteristic, and said first transistor is turned on to conduct a current at a lower voltage than said second transistor.

9. The OTP memory cell of claim 5 further comprising:
a sensing circuit connected to said OTP memory for sensing one of said three different states of said OTP memory cell.

10. The OTP memory cell of claim 5 wherein:
said OTP memory comprises a poly-insulator-poly (PIP) trimming element comprising a dielectric layer disposed between a first conductive polysilicon segment and a second conductive polysilicon layer wherein said dielectric layer further includes at least a breakdown vulnerable point for changing from an intrinsically a non-conductive state to said conductive state through an induced voltage breakdown at said breakdown vulnerable point;
and said first conductive polysilicon segment further includes an etch undercut having a undercut corner covering by said dielectric layer with said breakdown vulnerable point disposed near said undercut corner.

11. The OTP memory cell of claim 10 wherein:
said second conductive polysilicon layer extending into said etch undercut underneath said dielectric layer covering said a bottom surface of said first conductive polysilicon segment exposed by said etch undercut.

12. The OTP memory cell of claim 10 wherein:
said first conductive polysilicon segment further includes an etch undercut having a undercut corner covering by said dielectric layer for generating an edge electric field for inducing a breakdown in said dielectric layer covering thereon.

13. The OTP memory cell of claim 5 further comprising:
a pass gate select block functioning as a switching circuit connected to said first and second transistors for applying said two different voltages selectively through one of said first and second transistors to said OTP memory.

14. The OTP memory cell of claim 5 wherein:
said first transistor having said linear I-V characteristic conducts a greater current and said second transistor having a nonlinear I-V characteristic.

15. The OTP memory cell of claim 13 further comprising:
a probing circuit for applying said two different voltages selectively through one of said first and second transistors on said OTP memory for measuring one of said three different states of said OTP memory cell.

16. The OTP memory cell of claim 13 wherein:
said OTP memory is connected to a drain terminal of said first and second transistors and a switching circuit is connected to a gate of said first and second transistors to select one of said first and second transistors to apply said two different voltages to said OTP memory to sense said three different states of said OTP memory cell.

17. A method of manufacturing a one-time programmable memory on a substrate including a trimming element for programmable the OTP memory comprising:
forming a polysilicon-insulation-polysilicon segment by forming a field oxide layer on top of the semiconductor substrate followed by depositing, ion implanting and patterning a first polysilicon layer into a first polysilicon segment on top of said field oxide layer; and
forming an overlying oxide layer over a top surface followed by etching the overlying oxide layer with an overetch to undercut said field oxide layer below said first polysilicon segment to form a undercut space with bottom corners below a bottom surface of said first polysilicon segment.

18. The method of claim 17 further comprising:
forming a thin oxide layer for covering over said first polysilicon segment and covering over said bottom surface and said bottom corners of said first polysilicon segment;
a second polysilicon layer is deposited on top of said thin oxide layer followed by ion implanting and patterning said second polysilicon layer; and
applying a contact mask to open contact openings to form electrical contact to contact said first polysilicon segment and said second polysilicon layer.

19. The method of claim 18 wherein:
said step of ion implanting said second polysilicon layer comprising a step of implanting with an N-type ions.

20. The method of claim 18 wherein:
said step of depositing and patterning said second polysilicon layer further comprising a step of forming said second polysilicon layer having a lower part extending into said undercut space below said first polysilicon segment.

21. The method of claim 18 wherein:
said step of forming said thin oxide layer between said first polysilicon segment and said second polysilicon layer further comprising a step of forming said thin oxide layer approximately between three to eight Angstroms.

22. The method of claim 18 wherein:
said step of forming said first polysilicon segment and said second polysilicon layer further comprising a step of forming said first polysilicon segment and said second polysilicon layer having a thickness approximately between 500 to 2000 Angstroms.

* * * * *